SWEEP GENERATOR METHODS AND APPARATUS

Filed Sept. 29, 1955 2 Sheets-Sheet 1

INVENTOR.
WILLIAM D. GABOR
BY
Curtis, Morris & Safford.
ATTORNEYS

Sept. 29, 1959 W. D. GABOR 2,906,967
SWEEP GENERATOR METHODS AND APPARATUS
Filed Sept. 29, 1955 2 Sheets-Sheet 2
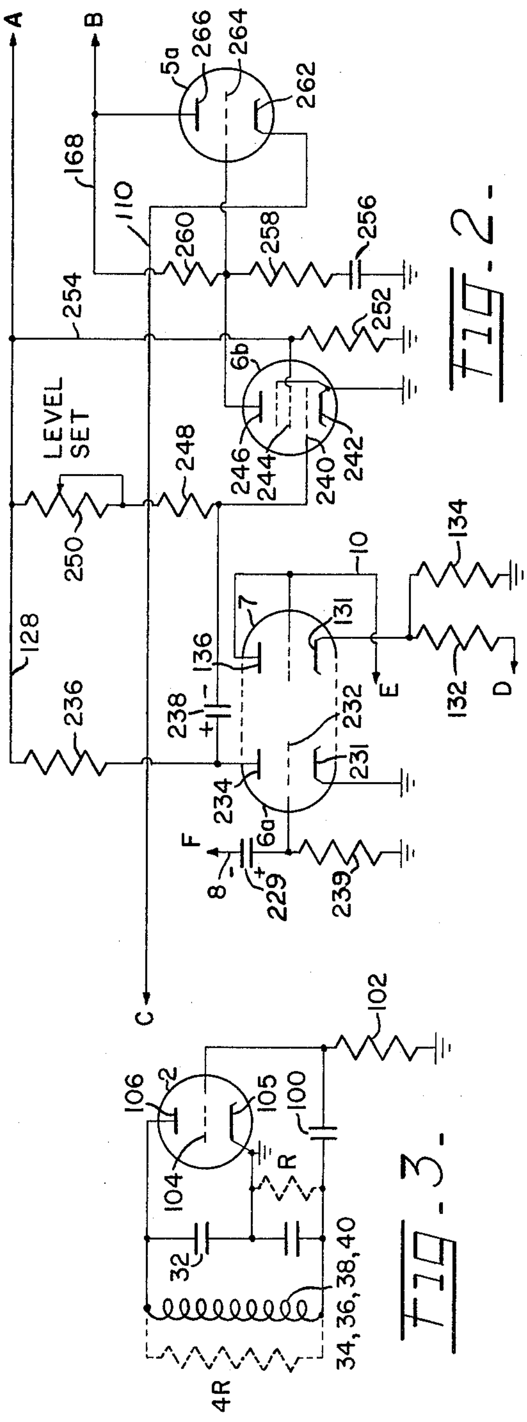
FIG. 2, FIG. 3
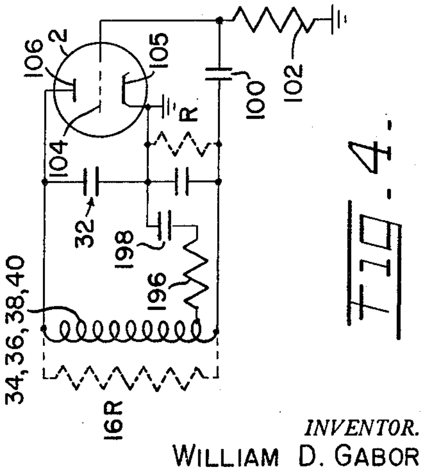
FIG. 4
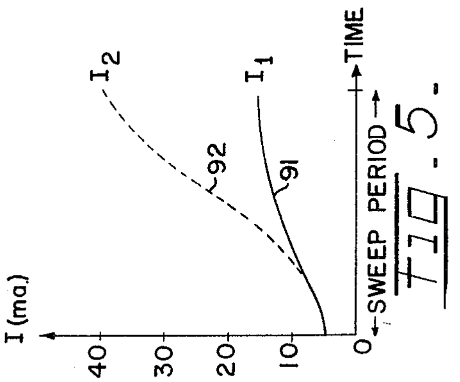
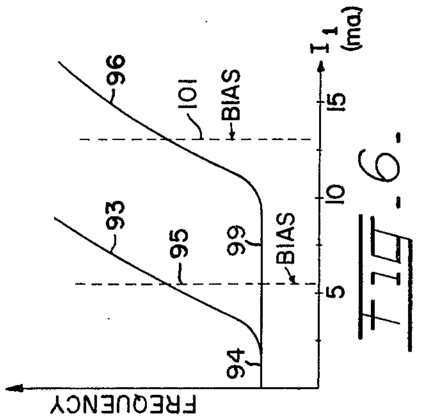
INVENTOR.
WILLIAM D. GABOR
BY
Curtis, Morris & Safford.
ATTORNEYS United States Patent Office 2,906,967
Patented Sept. 29, 1959

2,906,967

SWEEP GENERATOR METHODS AND APPARATUS

William D. Gabor, Norwalk, Conn., assignor to C.G.S. Laboratories, Inc., Stamford, Conn., a corporation of Connecticut Application September 29, 1955, Serial No. 537,442

13 Claims. (Cl. 331—178)

The present invention relates to improved sweep generator methods and apparatus utilizing a controllable inductor for controlling the sweep in frequency. Certain aspects of this invention are in the nature of improvements over the sweep generator disclosed and claimed in my prior copending application Serial No. 457,227, filed September 10, 1954, now Patent No. 2,813,975, issued November 19, 1957.

It is among the objects of the present invention to provide improved sweep generators having increased ranges, increased linearity in sweep, ease of control and more uniform amplitude of output signal over these increased ranges and which are less complex than any prior sweep generators and are more economical and which are highly suited for use in a wide variety of applications.

In the sweep generator circuits described herein the resonant frequency of the oscillator tank circuit is controlled by the effective inductance of the signal windings of a controllable inductor. The effective inductance of these signal windings is periodically varied by surges of current flowing through a control winding on the inductor, causing the frequency of the oscillator to sweep through a range of frequencies during each surge in the control current. In the circuits described herein the width of sweep is readily adjusted by setting the amplitude of the surges in the control current. A variable condenser in the oscillator tank circuit adjusts the mid-frequency of the sweeps, and a multi-position switch changes the connections among the signal windings to provide a number of different frequency bands of operation.

Among the many advantages of the methods and apparatus disclosed herein are the desirable shaping of the wave form of the control current surges by resonating the inductance of the control winding with capacitance means included in a circuit associated with the control winding and also the greatly improved linearity of the frequency sweep enabled to be provided by this resonant shaping of the control current waveform. Moreover, this resonant shaping enables the effective peak value of the control current surge flowing in the control winding itself to be increased without causing a correspondingly increased current flow in the remainder of the control circuit.

A further advantage of the resonant shaping provided in the circuits described is that it enables the utilization of ordinary sinusoidal voltages to develop peaked current waveforms well adapted to overcome any saturation effects which may appear in the control characteristics of controllable inductors.

Improved linearity and increased range of sweep are provided by the method and apparatus described. A clamping circuit acts to stop the oscillations at the end of each sweep, and during the periods between sweeps the control current returns to its initial value. These are the retrace periods, and because of the clamping action the output is held at zero. Thus, advantageously, when the sweep circuits described are used with an oscilloscope, the "retrace" provides a very convenient horizontal reference line across the face of the cathode ray tube.

During the periods when the oscillator is being swept in frequency, a control circuit acts to hold the amplitude of the output signal substantially constant. The resulting sweep signal of constant amplitude is well suited for testing and measuring television sets, frequency modulation receivers, transmission lines and cables, antenna patterns and characteristics, the "Q" (quality) factor of resonant circuits and components in the very high frequency ranges, and so forth.

A further advantage of the sweep generator circuits described is the dual function of the clamping circuit. Both the clamping circuit and control circuit are coupled to a common point in the oscillator circuit, so that this clamping circuit both stops the oscillator and prevents operation of the control circuit during the retrace periods.

Another advantage of the methods and apparatus described is that the bias voltage for the control electrode of the second electronic device in the control circuit is obtained during the retrace periods and is then stored for use during the periods of sweep. As a result, the whole control circuit operates without any negative voltage supply. Moreover, advantageously the current supply to the oscillator circuit and the current supply to the second electronic device in the control circuit occur at alternate times, reducing the maximum current drain from the power supply.

Other and further advantages of the sweep circuits described are the automatic self-adjustment of the control circuit so as to maintain itself in the center of its dynamic range regardless of the fact that the widely different frequencies obtainable from the different bands cause wide changes in the voltages in the oscillator circuit. In the sweep circuits described, switching from band to band varies the mean value of the surges of the control current to produce the desired linearity in frequency change per unit time.

Still further features of the circuits described are the desirable reduction in loading of the tank circuit obtained in the low frequency band and the non-resonant filter choke with a "lossy" ferrite core.

The operation of the circuits described is quick and easy. For example, in testing TV receivers or other equipment, the adjustable condenser is set to a frequency at the mid-point of the desired sweep and the amplitude of the control current surges is adjusted to give the desired width of sweep. The sweep width can be expanded up to a very wide range or contracted down to zero. This control of width is continuous, not step-by-step. The methods and apparatus described are adapted to sweep the frequency up or down through the mid-point. The circuits described are arranged to sweep the frequency upwardly.

In this specification and in the accompanying drawings, are described and shown highly advantageous embodiments of my invention and various modifications thereof are indicated, but it is to be understood that these are not intended to be exhaustive nor limiting of the invention, but on the contrary are given for purposes of illustration in order that others skilled in the art may fully understand the invention and the manner of applying the method and apparatus in practical use so that they may modify and adapt it in various forms, each as may be best suited to the conditions of a particular sweep generator application.

The various objects, aspects, and advantages of the present invention will be more fully understood from a consideration of the following specification in conjunction with the accompanying drawings, in which:

Figure 2 is a schematic circuit diagram of a modified form of the improved sweep generator embodying the methods and apparatus of the present invention;

Figure 3 is a simplified illustration of the oscillator circuit of Figure 1 for purposes of explanation;

Figure 4 is another simplified illustration similar to Figure 3; and

Figures 5 and 6 are graphs of control current components for purposes of explanation.

Figure 1:
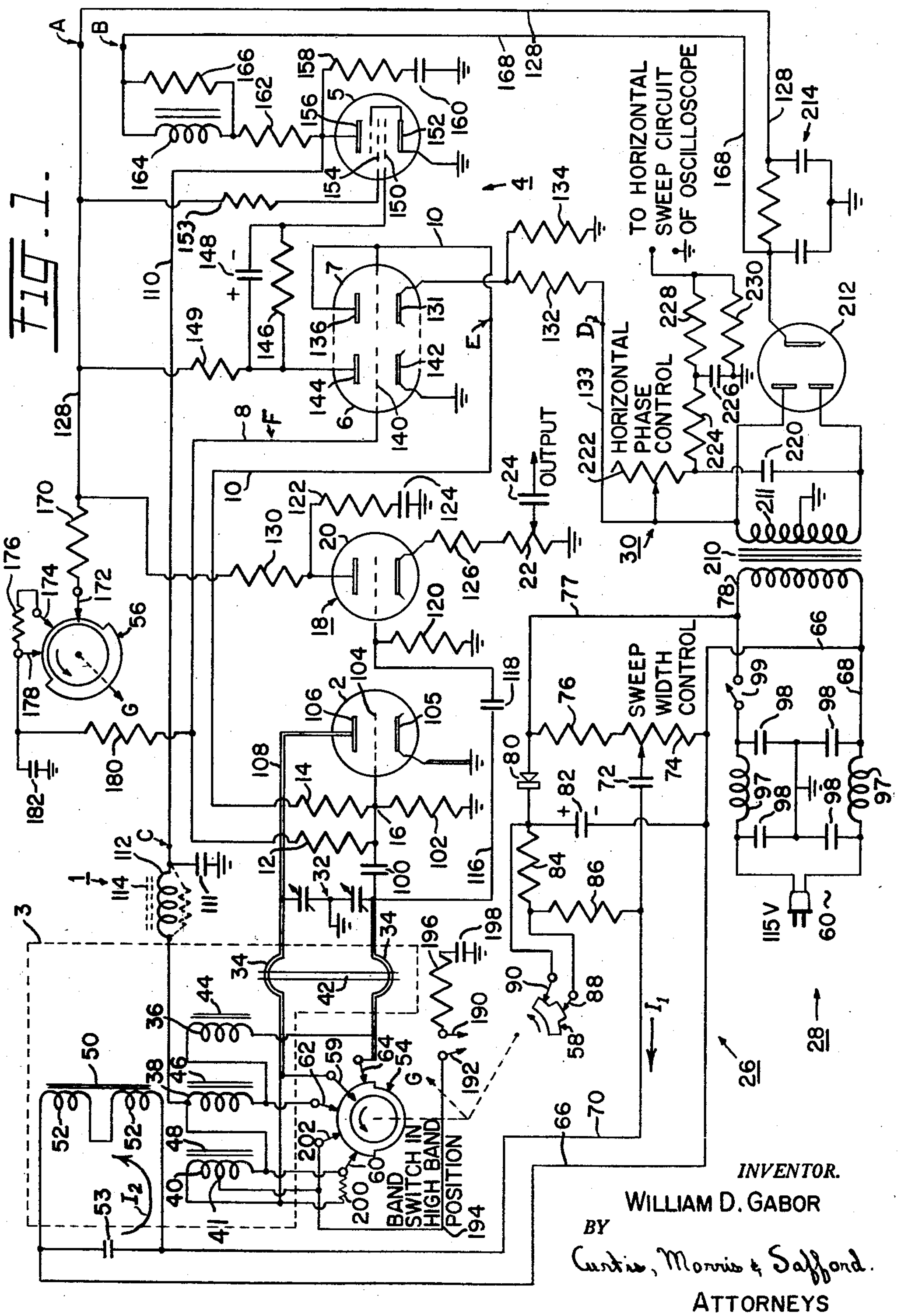
Figure 1 is a schematic circuit diagram of an improved sweep generator circuit having four frequency bands of operation and embodying the methods and apparatus of the present invention.

*General description of sweep generator of Figure 1*

The oscillator circuit which is swept in frequency is at the upper left of the drawing and is generally indicated at 1, including an electronic oscillating device 2 shown as a triode and a controllable inductor indicated within the dotted line 3. At the right of the drawing is a voltage regulation and control circuit, generally indicated at 4, and including an electronic current flow regulating device 5 and an amplifying device 6, shown for example, as a current flow shunt regulator pentode tube 5 and an amplifier regulator control triode tube 6, respectively. This control circuit 4 serves to hold the level of the oscillations in the oscillator circuit 1 at a constant amplitude regardless of the frequency or width of sweep and cuts off the flow of power to the oscillating device 2 at the end of each sweep, as explained in detail below. Adjacent to the control amplifier 6 is an electronic blanking device 7 shown as a diode-connected triode tube 7 used as a blanker to stop the oscillations at the end of each sweep, as explained below. Both the control circuit 4 and the blanking device 7 are coupled by leads 8 and 10 and resistors 12 and 14, respectively, to a common point 16 in the oscillator circuit 1, producing several advantageous operating characteristics.

The signal generated by the oscillator circuit is fed through a cathode-follower stage 18, including the triode 20, to an attenuator control 22 and is coupled through a condenser 24 to the output circuits.

The width of sweep and the high degree of linearity afforded by this sweep-generator is regulated by a sweep control circuit, generally indicated at 26, and shown below the oscillator circuit 1. The power supply 28 is shown at the bottom of the drawing, including a horizontal sweep control circuit 30 adapted for connection to the horizontal sweep circuit of an oscilloscope.

*Detailed description and operation of sweep generator of Figure 1*

The oscillator circuit 1 is basically a Colpitts oscillator, with the oscillating device 2 coupled to a resonant tank circuit including a two section variable condenser 32 and one or more of four signal windings 34, 36, 38 and 40 of the controllable inductor 3. The highest frequency signal winding 34 is divided into two haves around opposite sides of a signal core portion 42. The next highest frequency signal winding 36 is in certain instances also included on this same core portion 42, but, as shown, it may be included on a separate core portion 44. The next lower frequency, and lowest frequency signal windings 38 and 40, respectively, are wound on a pair of separate signal core portions 46 and 48.

In order to control the frequency of the signals in the circuit 1, the inductances of the signal windings 34, 36, 38, and 40 are varied by changing the permeability of their respective core portions 42, 44, 46, and 48 by means of magnetic flux from a control core portion or yoke diagrammatically indicated at 50. A control winding is on this yoke divided into two series-connected halves 52. The magnitude of the control current in the windings 52 thus regulates the oscillator frequency. An increase in the current in the control windings 52 increases the saturation of the signal winding core portions 42, 44, 46, and 48. This lowers the inductance of the signal winding or windings being used, and hence sweeps the resonant frequency of the oscillator tank circuit upwardly and accordingly sweeps upwardly the frequency of the signals generated.

To provide advantageous resonant shaping of the waveform of the current surges sent through the control winding 52, I connect a capacitor 53 across the winding. This resonant shaping of the control current is explained below.

In order to switch the oscillator circuit 1 from one to another of four different frequency bands of operation, a four-position triple-ganged switch 54, 56, and 58 is used. A detailed disclosure of a suitable controllable inductor circuit 3 and band switch 54 is made, and it is claimed in my copending application Serial No. 457,265, filed September 20, 1954. With the switch 54 in band No. 1 position all of the signal windings 34, 36, 38 and 40 are connected in series, thus providing the greatest effective inductance and hence the lowest range of frequencies. As the switch is turned clockwise to higher bands, that is, to band No. 2, No. 3, and No. 4 positions respectively, the windings 40, 38, and 36 are shorted out in succession by the conductive switch disk which connects the long contact 59 with the shorter contacts 60, 62, and 64 in succession. Switch 54 is shown in band No. 4 position in which all of the windings except the split winding 34 are short-circuited for operation over the highest frequency range.

In order to provide a suitable control current in the control windings 52, one side of these windings is connected by a lead 66 to one wire 68 of a 115 volt, 60 cycle A.C. power circuit indicated by the conventional plug. The other side of the control windings is connected by a lead 70 and a condenser 72 to the manually adjustable contact of a sweep width control potentiometer 74 connected by a lead 77 across the power lines 68 and 78 in series with a resistor 76. A half-wave rectifier 80 is connected from the lead 77 to one terminal of a large condenser 82, suitably of the electrolytic type, whose opposite terminal is connected to the opposite power line 68. Thus, the condenser 82 is charged and feeds a substantially steady direct (bias) current in series through a pair of resistors 84 and 86 and through the windings 52. This bias current establishes a desired mean value of saturation in the signal winding core portions 42, 44, 46, and 48. The setting of the condenser 32 in conjunction with the mean value of the bias current serves to establish the mid-frequency about which the sweep occurs. Superposed upon this steady bias current is the alternating current fed from the sweep width control 74 through the isolating condenser 72. The relative values of the circuit components in the control circuit 26 are such that when the contact is moved to the top of the sweep width control 74 for producing maximum width of sweep the current through the control winding 52 almost drops to zero once during each cycle of the A.C. fed through the condenser 72. Then it surges to a maximum value at a time one-half cycle later and drops back again toward zero at the end of the cycle. The oscillator circuit sweeps upwardly in frequency during the half cycle when the current in the control winding is increasing. Lower positions of the sweep width control 74 produce smaller changes in the control current and correspondingly smaller changes in swept frequency.

To obtain resonant shaping of the control current $I_2$ in the windings 52 the capacitor 53 has a capacitance value so large that its resonant frequency with the inductance of the windings 52 is considerably below 60 cycles per second or an odd multiple of 60 c.p.s. when the control yoke 50 is unsaturated. However, as the current $I_2$ increases the control yoke becomes partially saturated and its effective inductance falls. Thus, the resonant frequency of capacitor 53 and windings 52 rises up toward 60 c.p.s. or toward said odd multiple and reaches this value when $I_2$ is a maximum (in band No. 4). The highly advantageous result is that the current $I_2$ flowing in the control windings becomes far larger than the current $I_1$ drawn from the sweep control circuit 26. As shown in Figure 5, by the curves 91 and 92 at the beginning of each sweep period $I_1$ and $I_2$ are of the same magnitude, about 5 milliamperes. At the end of the sweep $I_1$ has risen to 15 ma. but $I_2$ reaches 40 ma. Moreover, the shape of $I_2$ with its desirable fast rise near the end of the sweep overcomes the tendency for the inductance changes of the signal windings to slow down toward the end of the sweep. A greatly improved linearity in the rate of change of frequency results. I find that resonant shaping at the first or the third multiple of the sweep repetition rate is particularly effective in these circuits.

A further advantage of this resonant shaping is that its action increases with increased sweep widths where its benefits are most needed. This is because the larger peak values of $I_2$ associated with the wider sweeps result in shifting the resonant frequency of condenser 53 and windings 52 more nearly up to 60 c.p.s. or to an odd multiple thereof, as the case may be. The required size and capacity of the electrical components in the sweep control circuit is reduced because of the effective current magnification brought about by this resonant shaping.

Figure 6 illustrates generally a characteristic of yoke type controllable inductors. As shown by the curve 93, there is an initial period 94 or "porch" during which the control current can increase by considerable amounts above zero before the inductance of the signal winding begins to decrease and the frequency to increase. For reasons explained in my above copending application, the diameter of the core portion 42 of the highest frequency signal winding is larger. Its curve 96 of frequency versus control current exhibits a correspondingly increased "porch" effect 99. To overcome this effect in band No. 4 the bias current from the condenser 82 is increased from the value 95 at the mid-point of the slope of the curve 93 to the value 101 at the mid-point of the curve 94. This bias increase is obtained by short-circuiting the resistor 84 by means of the ganged switch 58 which bridges the contacts 88 and 90.

In the sweep generator shown the bias current is 5.3 ma. for the first three bands and 13.5 ma. for band No. 4. This increased bias current enhances the resonant shaping effect, for it moves the resonant frequency of the control winding inductance up to 60 c.p.s. and provides the greatest degree of current magnification for improved linearity and range at the high end of the highest band.

The switch 58 also is used effectively in the band No. 1 position as explained further below.

Between the leads 68 and 78 and the plug is a balanced high frequency filter circuit including a pair of coils 97 in series with the lines and four shunt capacitors 98 connected to the common return circuit of the instrument, i.e. connected to "ground."

In the oscillator circuit, the junction of the two halves of the adjustable condenser 32 is connected to "ground," i.e. to the common return circuit. One side of this condenser is coupled through a condenser 100 and across a grounded grid return resistor 102 to the control electrode or grid 104 of the electronic oscillating device 2 having its mobile charge emitting electrode or cathode 105 grounded. The mobile charge collecting electrode or anode 106 of the electronic device 2 is directly connected to the other side of the condenser 32 by a lead 108. The high voltage direct current power for the electronic device 2 is fed from the control circuit 4 through a lead 110, over a grounded filter condenser 111 and through a radio frequency choke 112 and through the signal winding 40 and the lead 108 to the anode 106.

In order to increase the impedance of the choke 112 for completely isolating the control circuit 4 from the oscillator circuit and to prevent any spurious resonances which suck energy out of the oscillator, a ferromagnetic ceramic core 114 is inserted in the choke 112. This material is also known as ferrite, such as is described by Snoeck in U.S. Patents Nos. 2,452,529; 2,452,530; and 2,452,531. The ferrite core 114 used is one which exhibits extreme lossiness within the range of frequencies used and serves to damp out any spurious resonances which might otherwise develop within the choke winding. A highly advantageous form of the choke 112 is a wire wound resistor with a rod of lossy ferrite inserted the full length of the resistor. The lossiness of the core 114 as it interacts magnetically with the winding 112 causes an effective resistive component across the choke as indicated diagrammatically.

The signal output from the oscillator circuit 1 is coupled from one side of the winding 34 at the junction with the condenser 100 through a lead 116 and a coupling condenser 118 and across a grid return resistor 120 to the control electrode or grid of the electronic device 20 in the cathode follower stage 18. The signal is fed from the cathode of the device 20 through a resistor 126 to the output attenuator 22. A condenser 124 in series with a resistor 122 of low value to suppress spurious oscillations effectively ties the anode of the device 20 to ground for alternating signals. A lead 128 from the power supply 28 feeds high voltage direct current power through an anode load resistor 130 to the cathode-follower stage 18.

In operation, during alternate half cycles of the A.C. in the power mains 68 and 78 while the current in the winding 52 is increasing and the oscillator circuit 1 is sweeping upwardly in frequency a positve voltage is fed to the cathode 131 of the blanking device 7. This voltage is fed through a lead 133 from one side of the secondary winding 211 of a power supply transformer 210 whose primary winding is connected across the power lines 68 and 78. A resistor 132 in series with the lead 133 and a resistor 134 shunted to ground act as voltage divders for applying the desired magnitude of the voltage to the cathode 131. The cathode is used as the control electrode. When it is positive relative to the anode, the electronic blanking device 7 has no effect upon the operation of the oscillator circuit.

During intermediate half cycles, the cathode 131 is pulled far negative by the voltage fed from the lead 133, placing the diode 7 in full conduction and feeding a negative voltage over the lead 10 and through the isolating resistor 14 to the common point 16 connected to the control electrode 104 of the oscillating device 2. This negative voltage cuts off conduction through the device 2, blanking off all oscillations.

This negative voltage is also used advantageously to stop operation of the control circuit and thus reduce the anode voltage supplied to the device 2 to a very low value to assure complete blanking of the oscillator during the retrace periods. From the point 16 the negative voltage is fed through the isolating resistor 12 and along the lead 8 to the control electrode 140 or grid of the electronic amplifying device 6 having its mobile charge releasing electrode 142 grounded. All conduction through the device 6 ceases, causing the voltage of its anode 144 or charge collecting electrode to rise up toward the value of the supply voltage fed from the lead 128 through an anode load resistor 149 to the anode 144. This large positive voltage at the anode 144 is applied through a resistor 146 to the control electrode or grid 150 of the electronic current flow regulating device 5 having its mobile charge releasing electrode or cathode 152 grounded and having its screen grid 154 energized from the supply line 168 through a voltage dropping resistor 153. Thus, the device 5 is conditioned for full conduction of current from the power supply 26 through a lead 168 and through a series impedance network including a resistor 162 in series with a choke coil 164 shunted by a resistor 166. The voltage at the charge collecting electrode or anode 156 of the tube 2 is pulled down close to zero, dropping the voltage in the lead 110 sharply below that for sustaining oscillations in the device 2. An advantage of the choke 164, is that when full conduction through the regulator 5 is stopped, a large voltage appears across the choke, available for starting the oscillator. The resistor 158 in series with the condenser 160 in the control circuit 4 serves to prevent control loop oscillations.

During blanking, the large positive voltage fed from the anode 144 causes the grid 150 of the shunt regulator device 5 to draw current, charging up a condenser 148 which is in parallel with resistor 146 with a polarity as indicated. This charged condenser serves to supply negative grid bias to the current flow regulator 5 during the intervening half cycles, making any negative voltage supply unnecssary for the two stage control circuit 4.

When the oscillator circuit is in oscillation a negative voltage appears on the grid 104 whose magnitude increases with increasing amplitude of oscillations. This negative grid voltage is effectively measured by the control circuit 4 during the periods of oscillation being fed through the resistor 12 and lead 8 to the control electrode of the amplifying device 6. The negative voltage on the condenser 148 holds the control electrode 150 at the proper value for current flow control action. Should the amplitude of the oscillations tend to increase, an increasing negative voltage on the control electrode 104 of the oscillating device 104 reduces the current flow through the amplifying device 6, raising the voltage applied to the grid 150, thus increasing the current flow through the regulator 5 and dropping the voltage on the lead 110. This counteracts any tendency for the amplitude of oscillations to increase. Similarly, if the amplitude of the oscillations tends to decrease, the voltage on the lead 110 increases to maintain the amplitude of the output constant regardless of frequency sweep.

In the lower bands 1 and 2, the oscillation amplitude is greater, and the resulting larger negative voltage at the grid 104 tends to force the grid 140 so low as to cut off the amplifier 6 or drive it below its linear range. In order to counteract this larger negative voltage on the lead 8, the switch 56 and associated circuit elements is used. In bands 3 and 4 the switch 56 has no effect. In band 2 it applies a positive voltage from the lead 128 to the lead 8, to obtain the desired smaller negative voltage at the control electrode 140 to place the amplifier 6 squarely within the center of its linear range. The connection is made through a voltage dropping resistor 170, between the contacts 172 and 174, and through the resistors 176 and 180 and past a grounded filter condenser 182 to the lead 8.

In band No. 1, the switch 56 interconnects the contacts 174 and 178, to bypass resistor 176 and further raise the positive voltage fed to the line 8 to counteract the larger negative voltage in this band, producing highly satisfactory control action in circuit 4.

As illustrated in Figure 3, my theory for the operation of the oscillator circuit in band 1 is that the resistive component R of the input impedance of the oscillating device 2 is shunted across one-half of the variable condenser 32. Effectively, R is shunted across only one-half of the total inductance, and due to autotransformer effect this resistance R is reflected across the total inductance of the tank circuit as 4R. In band 1 when all of the windings 34, 36, 38, and 40 are in series, the impedance of the tank circuit is high because of the large ratio of inductance to capacitance. Thus, the loading effect caused by 4R would be severe.

To reduce this loading, I find that a coupling capacitor 198 in series with a resistor 196 works very well when connected from the junction of the two halves of the condenser 32 to the mid-point 41 of the winding 40. This coupling capacitor effectively ties together these two points. Thus, in effect the resistance R becomes shunted across only about one-quarter of the total length of the inductance, including windings 34, 36, 38, and 40. By auto-transformer effect this resistance now appears as 16R across the whole tank circuit, which represents a much smaller load. These connections are made by the switch element 58 bridging the contacts 190 and 192, which is connected by the lead 194 to the mid-point 41 of coil 40.

The contact 202 serves to tie down the mid-point 41 and short-circuit it with the contacts 60 and 62 in bands 3 and 4 to prevent spurious resonances in the unused windings which would suck energy out of the oscillator circuit in these higher bands. Likewise, the resistor 196 in series with the capacitor 198, prevents undesired resonance between the capacitor 198 and its associated leads. I have found that there is an intermediate value for the resistor 196 which prevents undesired resonances and yet does not interfere with the desired tying of point 41 to the junction of the two condenser halves.

The resistor 200 shunted across the coil 40 holds the amplitude of oscillations in the low band at a desired level.

The power supply circuit 28 includes a full wave rectifier tube 212 having its cathode connected to the lead 168 and a conventional filter 214 including a pair of shunt condensers and a series resistor connected to the lead 128.

The horizontal sweep control circuit 30 includes a capacitor 220 in series with a phase control potentiometer connected across the secondary 211 of the power transformer with a filter circuit for smoothing the secondary voltage connected from the junction of these elements. The filter circuit includes a series resistor 224, a shunt condenser 226 and a voltage divider 228 and 230 connected to one of the output terminals.

*Detailed description and operation of the improved sweep generator of Figure 2*

The improved sweep generator circuit of Figure 2 is in many respects similar with that shown in Figure 1. Only those portions of the circuit which are different are shown in Figure 2. It is to be understood that the complete circuit is formed by connecting six leads A, B, C, D, E, and F at the correspondingly marked points in Figure 1 in lieu of the control circuit 4 and the blanking device 7.

In addition, the switch 56 and its three associated resistors 170, 176 and 180 and the condenser 182 are eliminated by use of the circuit of Figure 2 because of the automatic action of this circuit in maintaining the amplifier device 6a at the proper bias level corresponding to the center of its linear range.

In Figure 2 the blanker 7 and its associated circuits function the same as those in Figure 1. Other components of Figure 2 performing function similar to those of components of Figure 1 have corresponding reference numerals.

In operation, when the blanker 7 pulls the oscillator control electrode 104 far negative, a voltage is built up across a large coupling condenser 229 between the lead 8 and the control electrode or grid 232 of an electronic amplifying device 6a having its mobile charge releasing electrode 231 grounded. When the oscillator circuit is in operation, this voltage on the condenser 229 is applied across the grid return resistor 239 along with the voltage from the lead 8 and serves to hold the control electrode 232 at the desired voltage. Any excess positive voltage on the condenser 229 is removed at the time in each sweep period when the lead 8 is least negative by conduction between the grid 232 and cathode 231. The condenser 229 and resistor 239 are sufficiently large to have a time constant averaging out over several cycles so that the least negative voltage on the lead 8 corresponds with a voltage on the grid 232 of about zero. Thus, any changes in the voltage on the lead 8 all automatically fall within the dynamic range of the tube 6a. Among the advantages of this automatic bias regulation is that it also corrects for aging tube characteristics or any other changes in characteristics.

The charge collecting electrode or anode 234 of the amplifier *6a* is supplied from the supply lead 128 through a plate load resistor 236. The coupling condenser 238 functions similarly to the condenser 148 in coupling signals from the anode 234 to the control electrode 240 of another amplifier *6b* having its mobile charge releasing electrode or cathode 242 grounded. Also, the condenser 238 develops a voltage providing the proper bias for the amplifier *6b*.

To set the level of the output signals, a current-limiting resistor 248 in series with a potentiometer 250 are connected between the lead 128 and the control electrode, so as to vary the bias level and hence the gain of the amplifier *6b*. Screen voltage for the screen grid 244 is developed across a resistor 252 connected through a lead 254 to the supply lead 128. As shown, the amplifier *6b* is a pentode with its anode 246 or charge collecting electrode is connected through a resistor 260 to the supply lead 168. Amplified control signals appearing at the anode 246 are directly coupled across a resistor 258 in series with a grounded capacitor 256 to the control electrode 264 of a series current flow regulator *5a* having its mobile charge releasing electrode or cathode 262 connected to the lead 110 and its mobile charge collecting electrode or anode 266 connected directly to the supply line 168.

Among the advantages of the series regulator *5a* is that it reduces the current drain on the power supply.

I find that the following values for some of the circuit components are well suited to provide the desired operation:

| Resistors: | Value (ohms) |
|---|---|
| 12 | 100K |
| 14 | 6800 |
| 74 | 10K, 2 watt |
| 76 | 6800, 1 watt |
| 84 | 18K, 1 watt |
| 86 | 10K, 1 watt |
| 102 | 4700 |
| 112 | 500, wire wound |
| 146 | 1.5M |
| 158 | 220 |
| 196 | 20K |
| 200 | 20K |
| 239 | 4.7M |

where K=1,000, M=1,000,000.

| Condensers: | Value (farads) |
|---|---|
| 32 (each half) | 6 to 150 mmf. |
| 53 | .25 mf. |
| 72 | 8 mf. |
| 82 | 50 mf., electrolytic |
| 100 | 100 mmf. |
| 111 | 1,000 mmf. |
| 148 | .25 mf. |
| 160 | .06 mf. |
| 198 | 5,000 mmf. |
| 229 | .5 mf. |
| 238 | .5 mf. |

where: m=micro.

| Other components: | Type |
|---|---|
| 2, 20 | 12AV7 |
| 5 | 6CL6 |
| *5a* | 12B4 |
| 6, 7 (*6a*, 7) | 12AX7 |
| *6b* | 6AU6 |
| 212 | 6X4 |
| 164 | 30 henry |

Although resonant shaping is shown in Figure 1 as obtained by a parallel resonance with condenser 53 shunted across the winding 52, a series resonance shaping can also be employed to advantage in many instances in similar circuits.

From the foregoing description it will be understood that I have provided sweep generator methods and apparatus well adapted to provide the advantages set forth and that the apparatus may be changed or modified in accordance with the needs of particular applications and that the scope of my invention as defined by the following claims is intended to cover such alterations and modifications, limited only by the prior art.

What is claimed is:

1. Apparatus for generating cyclic sweeps in the frequency of a signal comprising a controllable inductor having control and signal core means of magnetically permeable material, control and signal windings, respectively on said control and signal core means, a resonant circuit, said signal winding being included in said resonant circuit and controlling the resonant frequency thereof, oscillator means coupled to said resonant circuit, said resonant circuit controlling the frequency of said oscillator means, alternating-current circuit means connectible to a source of alternating current, said alternating-current circuit means being connected to said control winding, and capacitance means shunted across said control winding, said capacitance means being resonant with said control winding at an odd multiple of the frequency of the alternating current during the portion of each cycle of the alternating current when the control core means approaches magnetic saturation, whereby as said control core means approaches magnetic saturation during said portion of each cycle, the current flowing through the control means increases more rapidly and becomes larger than the current being supplied to the control winding from the alternating-current circuit means.

2. Apparatus for generating cyclic sweeps in the frequency of a signal comprising a controllable inductor having magnetically coupled control and signal core portions, a control winding on said control core portion and a signal winding on said signal core portion, said control winding controlling the level of magnetic saturation in said control and signal core portions and controlling the effective inductance of said signal winding, a resonant circuit, said signal winding being included in said resonant circuit and controlling its resonant frequency and an electronic oscillating device having an electrode coupled to said resonant circuit, the frequency of said oscillating device being controlled by said resonant circuit, capacitance means in circuit with said control winding and having a capacitance value which is resonant with the inductance of said control winding at a predetermined frequency when said control core portion is in a predetermined condition of magnetic saturation, and an alternating current source connected to said control winding, said alternating current source having an alternating-current frequency which is equal to $1/n$ times said predetermined frequency, the denominator "$n$" being an odd integer.

3. Apparatus for generating cyclic sweeps in the frequency of a signal comprising a controllable inductor having a ferromagnetic core structure including a ferromagnetic signal core portion, a control winding on said control core structure and a signal winding on said signal core portion, said control winding controlling the magnetic saturation of said core structure and thus controlling the effective inductance of said signal winding, a frequency control circuit, said signal winding being included in said frequency control circuit, an electronic oscillating device having at least one electrode coupled to said frequency control circuit, the frequency of said oscillating device being controlled by the effective inductance of said signal winding, capacitance means in circuit with said control winding, said capacitance means being substantially non-resonant with the inductance of said control winding at a predetermined frequency when said core structure has a first predetermined condition of magnetic saturation and being resonant with said inductance at said predetermined frequency when said core structure has a second predetermined condition of magnetic saturation, and a source of alternating current connected to said control winding, said predetermined frequency being equal to an odd multiple of the frequency of said alternating source, said odd multiple being no greater than three.

4. Apparatus for generating cyclic sweeps in the frequency of a signal comprising a controllable inductor having a ferromagnetic core, a control winding on said core and a frequency generator circuit having frequency control circuit responsive to the magnetic saturation of said core, the frequency of said frequency generator circuit being varied by changes in the magnetic saturation of said core, capacitance means in circuit with said control winding, said capacitance means being substantially non-resonant with said control winding at a given frequency when said core is unsaturated and being substantially resonant with said control winding at said given frequency when said core is at least partially saturated, and circuit means connectible to a source of 60 cycle alternating current, said circuit means being connected to said control winding and including a rectifier and a filter condenser supplying unidirectional current to said control winding, said given frequency being equal to an odd integer times 60.

5. Apparatus as claimed in claim 4 and wherein said capacitance means is connected across said control winding and said circuit means is connected across said control winding, said circuit means including a potentiometer having a movable contact for regulating the magnitude of the alternating current fed to said control winding, and an isolation condenser in said circuit means between said movable contact and the control winding.

6. Apparatus for generating cyclic sweeps in the frequency of a signal comprising a controllable inductor having a control winding and a signal winding of which the effective inductance is controlled by the magnitude of the current flowing through said control winding, a frequency control circuit including said signal winding, an electronic oscillating device having a first input control electrode coupled to said frequency control circuit, said oscillating device generating an alternating signal of a frequency controlled by said signal winding, alternating current circuit means connectible to a source of alternating current and being coupled to said control winding, said circuit means cyclically changing the current flowing through said control winding in accordance with the cycles of the alternating current for cyclically changing the effective inductance of the signal winding to produce cyclic sweeps in the frequency of said alternating signal, a first isolating resistor connected to said first input control electrode, electronic blanking means connected between said alternating current circuit means and said first isolating resistor and producing cyclic changes in the voltage of said first control electrode in accordance with the cycles of the alternating current and preventing the generation of said alternating signal during a retrace period in each cycle, and an amplitude control circuit for controlling the amplitude of the alternating signals generated by said oscillating device, said amplitude control circuit including an electronic amplifier device having a second control electrode, and a second input isolating resistor connected between said second input control electrode and said first input control electrode, whereby the cyclic changes in the voltage of said first input control electrode are fed through said second isolating resistor to said second input control electrode for preventing the operation of said electronic amplifier in said amplitude control circuit during the retrace periods when the generation of said alternating signal is prevented.

7. Apparatus as claimed in claim 6 and wherein said electronic oscillating device has an output electrode and amplitude control circuit includes current flow control means connected to said output electrode, said current flow control means having a third input control electrode coupled to the output of said electronic amplifier device by a condenser effectively shunted by resistance means, the time constant of said condenser and resistance means being long relative to the sweep repetition rate of said apparatus.

8. Apparatus for generating cyclic sweeps in frequency as claimed in claim 6 and wherein said frequency control circuit includes band-selection switch means for switching to different frequency bands of operation, a source of voltage of predetermined polarity, and a third isolating resistor connected to said switch means, said switch means connecting said third isolating resistor in circuit between said source of voltage and said second input control electrode of said electronic amplifier when said band-selection means is switched to a predetermined one of said bands, and said band-selection switch means disconnecting said third isolating resistor from between said source and said second input control electrode when said band-selection switch means is switched to another band, whereby to supply voltage from said source to said second input control electrode when operating in said one band.

9. Apparatus for generating cyclic sweeps in the frequency of a signal comprising a controllable inductor having a control winding and a plurality of signal windings, a resonant circuit including a pair of condensers connected in series, an electronic oscillating device having an input circuit coupled across one of said condensers and an output circuit connected across the other of said condensers, switch means connected in said resonant circuit and connected to each of said signal windings and arranged to connect one or more of said signal windings in said resonant circuit across said pair of condensers, and a coupling condenser coupled to the junction of said pair of condensers, said switch means arranged to switch said coupling condenser in circuit between the junction of said pair of condensers and a point on one of said signal windings in said resonant circuit, said point being more closely adjacent to the one of said pair of condensers which is connected to the input circuit of said electronic oscillating device.

10. Apparatus as claimed in claim 9 and including a resistor in series with said coupling condenser between the junction of said pair of condensers and said point.

11. Apparatus for generating a plurality of bands of frequency and including an electronic oscillating device having an input circuit and a resonant circuit coupled to said input circuit and for preventing undue loading of the resonant circuit by said input circuit in at least the lowest frequency band comprising a controllable inductor having a control winding and a plurality of signal windings, said resonant circuit including a pair of condensers in series with a junction point therebetween, said electronic oscillating device having an input circuit coupled across one of said condensers and an output circuit connected across the other of said condensers, switch means connected to said resonant circuits and having a plurality of successive positions, a first of the successive switch positions coupling one of said signal windings across both of said condensers and the successive switch positions thereafter coupling progressively more of said signal windings in a series inductance circuit across both of said condensers, thereby providing progressively lower frequency bands, and a coupling condenser, said switch means in at least the lowest frequency band effectively conecting said coupling condenser from the junction of said condensers to a point near the end of said series inductance circuit which is more closely associated with the one of said condensers across which the input circuit of the electronic oscillating device is coupled.

12. Apparatus for generating cyclic sweeps in the frequency of an oscillator signal, and wherein each sweep is from one frequency to another frequency, and for retracing back from said other frequency to said one frequency without producing an alternating signal during said retracing comprising an oscillator circuit including an electronic oscillating device having a control electrode, a sweep control circuit coupled to said oscillator circuit and producing said cyclic sweeps in frequency of the alternating signal generated by said oscillator circuit, a blanking circuit including an electronic blanking device having a second control electrode coupled to said sweep control circuit and being controlled thereby, said blanking circuit being connected to said first oscillator control electrode and changing the voltage on said first oscillator control electrode for preventing said oscillator circuit from generating an alternating signal during said retracing, and an amplitude control circuit including an electronic device having a third control electrode, said third control electrode being connected to said first oscillator control electrode, said amplitude control circuit controlling the amplitude of the alternating signals generated by said oscillator circuit in response to the voltage on said first oscillator control electrode, whereby said electronic device in said amplitude control circuit is also responsive to said blanking circuit and is rendered ineffective by said blanking circuit during said retracing.

13. Sweep-frequency generator apparatus for cyclically sweeping over a range of frequencies in a selected one of a plurality of frequency bands, said apparatus comprising a controllable inductor including a magnetically permeable core structure having a control winding thereon and a plurality of signal core portions, and a plurality of signal windings, one signal winding being on each of said signal core portions; electronic oscillator means; a band-selection switch connected to said electronic oscillator means, said band-selection switch having a plurality of positions selectively connecting said electronic oscillator means to said signal windings in its respective positions for selecting the frequency band of operation; first circuit means connected to an alternating current source of conventional power frequency; a rectifier connected to said first circuit means; a filter condenser connected to said rectifier; second circuit means connected in serial relation with said filter condenser and said control winding for feeding unidirectional current from said filter condenser to said control winding, said band-selection switch including switch means connected to said rectifier and filter condenser, said switch means being responsive to the actuation of said band-selection switch into a predetermined one of said positions for changing the magnitude of the unidirectional current flowing through said control winding when said band-selection switch is in said one position; and sweep width control means including a potentiometer connected to said first circuit means, said potentiometer having a movable contact connected to said second circuit means.

References Cited in the file of this patent

UNITED STATES PATENTS

| | | |
|---|---|---|
| 1,965,649 | Jaumann | July 10, 1934 |
| 1,978,568 | Crossley et al. | Oct. 30, 1934 |
| 2,151,313 | Bagno et al. | Mar. 21, 1939 |
| 2,295,173 | Hoffmann et al. | Sept. 8, 1942 |
| 2,596,227 | Fernsler | May 13, 1952 |
| 2,597,237 | Friend | May 20, 1952 |
| 2,613,268 | Jaspers | Oct. 7, 1952 |
| 2,826,691 | Elliott | Mar. 11, 1958 |